United States Patent [19]

Kawagoe

[11] Patent Number: 5,726,949
[45] Date of Patent: Mar. 10, 1998

[54] SEMICONDUCTOR MEMORY DEVICE HAVING A REDUNDANT CONFIGURATION

[75] Inventor: Tomoya Kawagoe, Hyogo, Japan

[73] Assignee: Mitsubishi Denki Kabushiki Kaisha, Tokyo, Japan

[21] Appl. No.: 735,141

[22] Filed: Oct. 22, 1996

[30] Foreign Application Priority Data

Jan. 24, 1996 [JP] Japan ................... 8-010001

[51] Int. Cl.$^6$ ................... G11C 7/00
[52] U.S. Cl. ............ 365/230.06; 365/200; 365/149
[58] Field of Search ............ 365/200, 230.06, 365/149

[56] References Cited

U.S. PATENT DOCUMENTS 5,058,059 10/1991 Matsuo et al. ............ 365/200 X

FOREIGN PATENT DOCUMENTS

90-21571 12/1990 Japan.
5-78187 10/1993 Japan.

*Primary Examiner*—Joseph A. Popek
*Attorney, Agent, or Firm*—Lowe, Price, LeBlanc & Becker

[57] ABSTRACT

A semiconductor memory device includes a plurality of memory cells, a plurality of address detecting circuits capable of registering a defective address indicating a defective memory cell out of the plurality of memory cells for detecting whether an external address matches the defective address or not and each corresponding to 1 bit of the external address or complementary 1 bit thereof, and first and second terminals. Each of the address detecting circuits includes first and second capacitors each having a floating electrode formed of the same layer as a cell plate electrode of a memory cell, a fixed electrode formed of the same layer as a storage node electrode of the memory cell, and a dielectric layer formed of the same layer as a dielectric layer of the memory cell and formed between the floating electrode and the fixed electrode. If $2 \times Vcc$ is applied to the first terminal and $2 \times Vcc+\delta$ is applied to the second terminal, charges are charged in the first and the second capacitors. If ultraviolet rays are directed to the second capacitor, charges are left in respective floating electrodes of the first and the second capacitors, whereby the defective address can be registered in a non-volatile manner. Accordingly, the semiconductor memory device can be manufactured without increase in the number of manufacturing steps, and can replace a defective memory cell with a spare memory cell.

6 Claims, 6 Drawing Sheets

SEMICONDUCTOR MEMORY DEVICE HAVING A REDUNDANT CONFIGURATION

BACKGROUND OF THE INVENTION

1. Field of the Invention

The present invention relates to a semiconductor memory device and an address registering method thereof, and more particularly, to a semiconductor memory device having a redundant configuration for repairing defects in memory cells and an address registering method thereof.

2. Description of the Background Art

A semiconductor memory device such as DRAM (Dynamic Random Access Memory) generally includes a plurality of word lines, a plurality of bit lines, and a plurality of memory cells provided at respective intersections of the word lines and the bit lines. Furthermore, data is read/written from/to a memory cell located at an intersection of a word line and a bit line which are selected by an external address.

In a semiconductor memory device having a redundant configuration, an address of a defective memory cell, if any, is registered in an address circuit, and the defective memory cell is replaced with a spare memory cell which is used to repair a defective memory cell in the redundant configuration if the address is selected.

Figure 7:
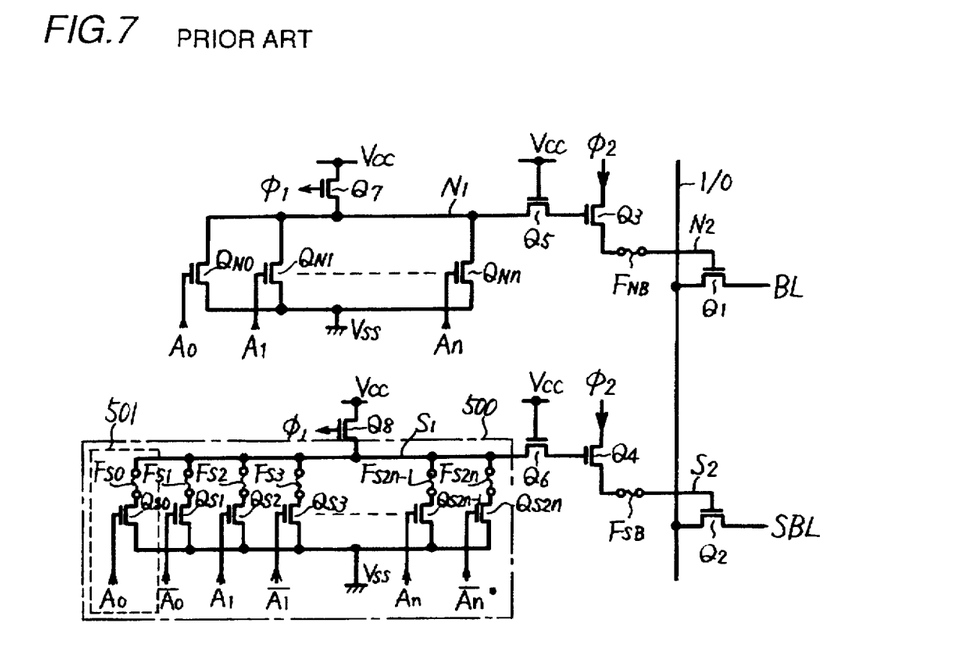
FIG. 7 is a circuit diagram showing a defective address registering circuit and a peripheral circuit thereof in a conventional semiconductor memory device.

FIG. 7 is a circuit diagram showing a defective address registering circuit 500 and a peripheral circuit thereof in a conventional semiconductor memory device (DRAM) disclosed in Japanese Patent Publication No. 5-78187.

Referring to FIG. 7, it is assumed that a memory cell connected to a bit line BL in the DRAM is defective. A spare bit line SBL is connected to a spare memory cell which is not shown.

The bit line BL is connected to a source electrode of an insulated gate field effect transistor (hereinafter referred to as FET) $Q_1$, and the spare bit line SBL is connected to a source electrode of an FET $Q_2$ (all the FETs in FIG. 7 are of an N channel enhancement type). FETs $Q_1$ and $Q_2$ have their drain electrodes connected to an I/O line I/O. FET $Q_1$ has its gate electrode connected to a node $N_2$, which in turn is connected to one electrode of a fuse $F_{NB}$, and another electrode thereof is connected to a source electrode of an FET $Q_3$. FET $Q_2$ has its gate electrode connected to a node $S_2$, which in turn is connected to a source electrode of an FET $Q_4$. FET $Q_3$ has its gate electrode connected to a drain electrode of an FET $Q_5$, and a power supply voltage Vcc is applied to respective gate electrodes of FETs $Q_5$ and $Q_6$.

A signal $\phi_2$ is input to respective drain electrodes of FETs $Q_3$ and $Q_4$. FET $Q_5$ has its source electrode connected to a node $N_1$, which in turn is connected to a source electrode of an FET $Q_7$ and respective drain electrodes of FETs $Q_{N0}$ to $Q_{Nn}$. FET $Q_6$ has its source electrode connected to a node $S_1$, which in turn is connected to a source electrode of FET $Q_8$ and one electrode of each of fuses $F_{S0}$ to $F_{S2n}$. Another electrode of each of fuses $F_{S0}$ to $F_{S2n}$ is connected to a drain electrode of corresponding one of FETs $Q_{S0}$ to $Q_{S2n}$. 1 bit (hereinafter referred to as address) $A_0, \overline{A_0}, \ldots, A_n, \overline{A_n}$ of an output signal of an address buffer which is not shown is input to each gate electrode of FETs $Q_{S0}$ to $Q_{S2n}$, and FETs $Q_{S0}$ to $Q_{S2n}$ have their source electrodes connected in common to a ground potential Vss. Either an address $A_X$ (where X=0, 1, . . . , n) or a complementary address $\overline{A_X}$ thereof is input to each gate electrode of FETs $Q_{N0}$ to $Q_{Nn}$.

Defective address registering circuit 500 includes 2n defective address detecting circuits 501 each corresponding to an address signal $A_X$ and or a complementary address signal $\overline{A_X}$ thereof. In FIG. 7, defective address detecting circuit 501 corresponding to an address signal $A_0$ is shown representatively.

It is assumed that addresses $A_0, A_1, \ldots, A_n$ are input in FIG. 7. FETs $Q_{N0}$ to $Q_{Nn}$ have their source electrodes connected in common to the ground potential Vss. A signal $\phi_1$ is input to respective gate electrodes of FETs $Q_7$ and $Q_8$, and the power supply voltage Vcc is applied to respective drain electrodes thereof.

Figure 8:
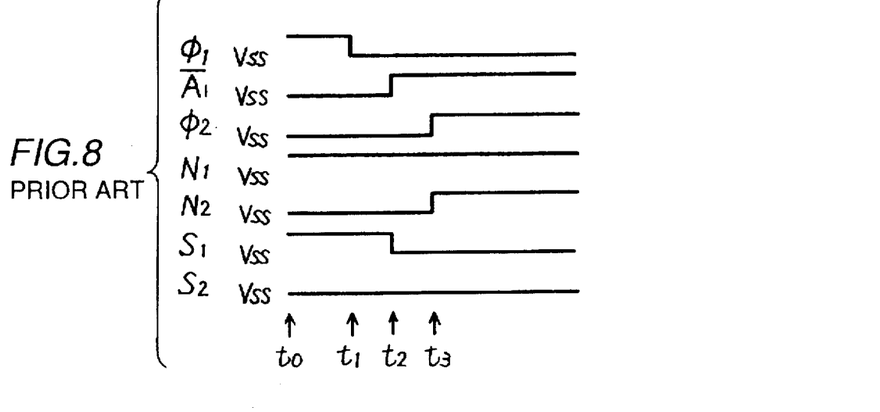
FIG. 8 is a voltage waveform chart illustrating the operation of a defective address detecting circuit of FIG. 7.

FIG. 8 is a voltage waveform chart illustrating the operation of defective address registering circuit 500 and the peripheral circuit thereof shown in FIG. 7.

The operation of the circuits of FIG. 7 will now be described using the voltage waveform chart of FIG. 8. FIG. 8 shows voltage waveforms before a defective memory cell is replaced with a spare memory cell.

In FIG. 8, the signal $\phi_1$ is at "a logic high level (hereinafter referred to as H)" and node $N_1$ is precharged to an "H" level at times $t_0$ and $t_1$. Addresses $A_0, A_1, \ldots, \overline{A_n}$ attain an "H" level at time $t_2$. At this time, addresses $A_0, A_1, \ldots, A_n$ remain at "a logic low level (hereinafter referred to as L)", and node $N_1$ is retained at an "H" level. Therefore, FET $Q_5$ is turned off.

If the signal $\phi_2$ attains an "H" level at time $t_3$, a potential of the signal $\phi_2$ is directly transmitted to node $N_2$ by the self-bootstrap effect and FET $Q_1$ is turned on, so that the bit line BL is selected and is connected to I/O line I/O. On the other hand, if addresses $\overline{A_0}, \overline{A_1}, \ldots, \overline{A_n}$ attain an "H" level at time $t_2$, FETs $Q_{S1}, Q_{S3}, \ldots, Q_{S2n}$ are turned on and node $S_1$ is discharged, so that spare bit line SBL will not be selected.

If a memory cell connected to bit line BL is defective, bit line BL is replaced with spare bit line SBL. In order to achieve this, fuses are blown so that connection of respective gate electrodes of FETs $Q_{S1}$ to $Q_{S2n}$ will become the same as that of respective gate electrodes of FETs $Q_{N1}$ to $Q_{Nn}$.

In the case of FIG. 7, fuses $F_{S1}, F_{S3}, \ldots, F_{S2n}$ are blown, and fuse $F_{NB}$ is further blown. After that, if nodes $N_1$ and $S_1$ are at an "H" level at time $t_2$ and the signal $\phi_2$ attains an "H" level at time $t_3$, node $S_2$ attains an "H" level and spare bit line SBL is selected. Since fuse $F_{NB}$ has been blown, node $N_2$ will not attain an "H" level and bit line BL will not be selected.

The fuses included in the conventional defective address registering circuit are formed of material such as polysilicon (p-Si). These fuses are blown by laser beams, whereby a defective address is registered.

In contrast to the DRAM which is a volatile memory, in a non-volatile memory (hereinafter referred to as EPROM) to which data can be written electrically, a non-volatile memory cell having a floating gate is used instead of the fuses to register a defective address.

As shown in FIGS. 7 and 8, however, in the case where a defective address is to be registered using fuses, when the fuses are blown, conical holes are produced in an upper portion of the fuses, so that interconnection wires located near the upper portion of the fuses might be damaged. In order to prevent this, interconnection wires and circuit elements such as transistors should be located in the region other than the periphery of the fuses, and therefore, large layout area is occupied to form the fuses.

On the other hand, in the case where a method of using a non-volatile memory cell such as in EPROM having a floating gate instead of using fuses to register a defective address is applied to a volatile memory such as DRAM, the step of forming the non-volatile memory cell (floating gate) is required, causing increase in the number of manufacturing steps.

SUMMARY OF THE INVENTION

It is an object of the present invention to provide a semiconductor memory device having reduced layout area, requiring no increase in the number of manufacturing steps and capable of registering a defective address and of replacing a defective memory cell with a spare memory cell, and a defective address registering method thereof.

A semiconductor memory device in accordance with one aspect of the present invention includes a plurality of memory cells and a plurality of address detecting circuits. Each of the plurality of memory cells includes a first capacitor having a cell plate electrode, a storage node electrode and a first dielectric layer formed between the cell plate electrode and the storage node electrode. The plurality of address detecting circuits are capable of registering a defective address indicating a defective memory cell out of the plurality of memory cells, and detect whether an external address matches the defective address or not. Each of the address detecting circuits corresponds to 1 bit of the external address or complementary 1 bit thereof. Each of the plurality of address detecting circuits includes a second capacitor having a floating electrode formed in the same layer as the cell plate electrode, a fixed electrode formed in the same layer as the storage node electrode and a second dielectric layer formed in the same layer as the first dielectric layer and formed between the floating electrode and the fixed electrode.

A method registering an address of a semiconductor memory device having a plurality of memory cells, a plurality of address detecting circuits and first and second terminals in accordance with another aspect of the present invention includes the steps of applying a prescribed voltage to the first terminal, applying a voltage higher than the prescribed voltage to the second terminal, and selectively directing ultraviolet rays to respective second capacitors of the plurality of address detecting circuits. The plurality of address detecting circuits are capable of registering a defective address indicating a defective memory cell out of the plurality of memory cells, and detect whether an external address matches the defective address or not. Each of the address detecting circuits corresponds to 1 bit of the external address or complementary 1 bit thereof. Each of the plurality of address detecting circuits includes first to third capacitors, a sense amplifier, and first and second MOS transistors. The first capacitor has one electrode connected to the first terminal. The second capacitor has one electrode connected to another electrode of the first capacitor. The sense amplifier has a first sense node connected to another electrode of the second capacitor, and a second sense node. The third capacitor has one electrode connected to the second sense node of the sense amplifier, and another electrode connected to the second terminal. The first MOS transistor has a source/drain electrode grounded, and a gate electrode receiving corresponding 1 bit of the address. The second MOS transistor has a source/drain electrode connected to another source/drain electrode of the first MOS transistor, and a gate electrode connected to the second sense node of the sense amplifier. The second MOS transistor in one of the plurality of address detecting circuits has another source/drain electrode connected to another source/drain electrode of the second MOS transistor in another address sensing circuit.

Accordingly, a primary advantage of the present invention is that the above mentioned semiconductor memory device can be manufactured without increase in the number of manufacturing steps and that a defective memory cell is replaced with a spare memory cell.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described in conjunction with the accompanying drawings. The same or a corresponding portion is denoted by the same reference in the figures.

(1) First Embodiment

Figure 1:
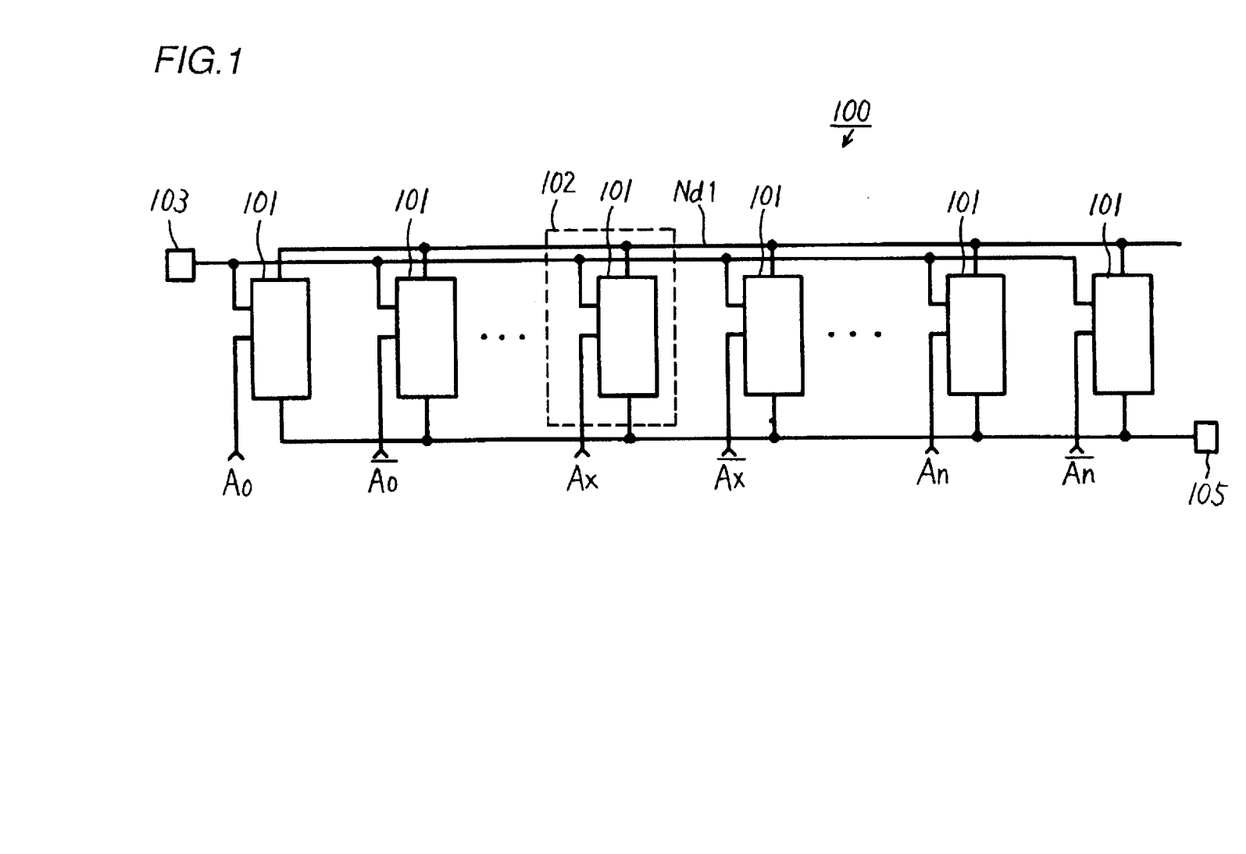
FIG. 1 is a block diagram showing a structure of a defective address registering circuit in a semiconductor memory device in accordance with one embodiment of the present invention.

Referring to FIG. 1, a defective address registering circuit 100 in a DRAM in accordance with a first embodiment of the present invention includes 2 (n+1) defective address detecting circuits 101 each provided corresponding to 1 bit $A_X$ (where X=0, 1, ..., n) of an external address or 1 bit $\overline{A_X}$ (where X=0, 1, ..., n) of a complementary address thereof, a power supply (Vcc) terminal 103, and a (½) Vcc terminal 105.

Power supply (Vcc) terminal 103 and (½) Vcc terminal 105 are connected in common to 2 (n+1) defective address detecting circuits 101.

In addition, 2 (n+1) defective address detecting circuits 101 are connected in common at a node Nd1.

Defective address registering circuit 100 of FIG. 1 corresponds to conventional defective address registering circuit 500 of FIG. 7, and defective address detecting circuit 101 of FIG. 1 corresponds to conventional defective address detecting circuit 501 of FIG. 7.

Figure 2:
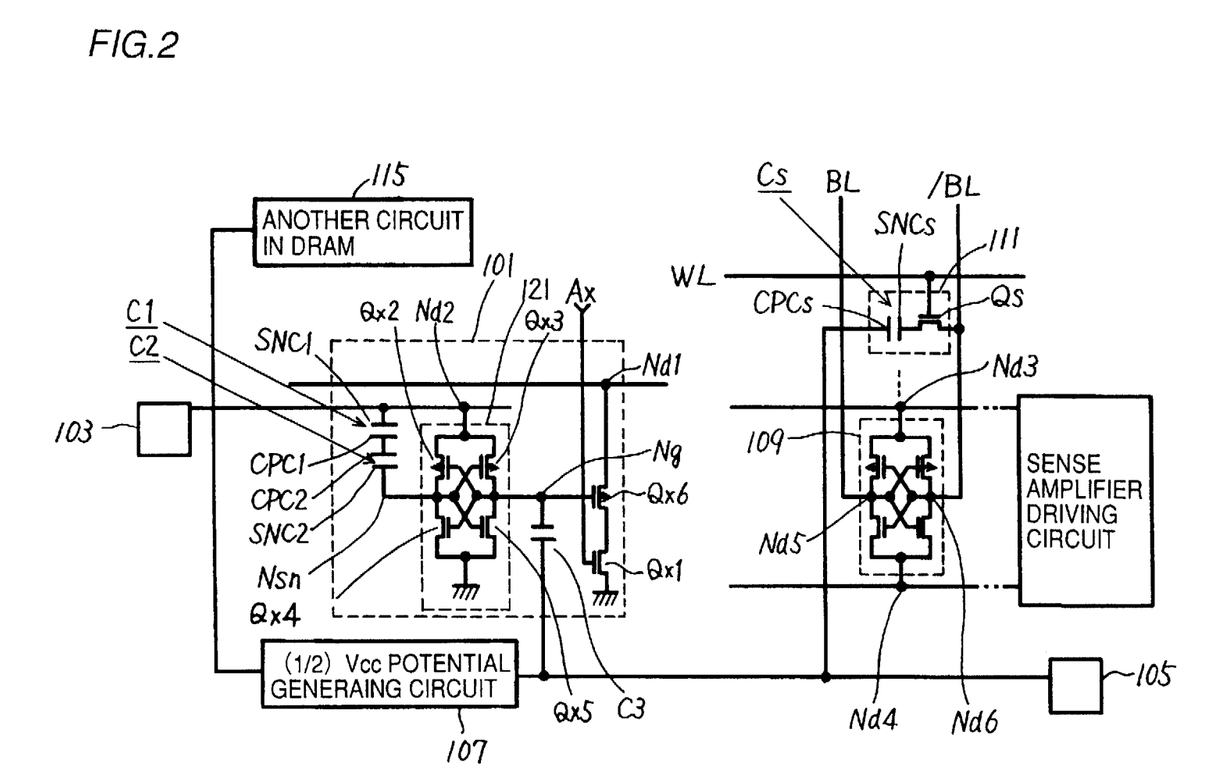
FIG. 2 is a circuit diagram showing a defective address sensing circuit in FIG. 1, a memory cell in a DRAM, and a peripheral circuit thereof.

In FIG. 2, one of 2 (n+1) defective address detecting circuits 101 is shown representatively. Referring to FIG. 2, defective address detecting circuit 101 for detecting whether 1 bit of a registered defective address matches corresponding 1 bit of an applied external address or not is connected to power supply (Vcc) terminal 103 to which a power supply voltage Vcc is supplied. A peripheral circuit includes (½) Vcc terminal 105, a (½) Vcc potential generating circuit 107, a sense amplifier 109, a sense amplifier driving circuit 113 for driving sense amplifier 109, a word line WL connected to a memory cell 111, and one bit line BL and another bit line /BL of a bit line pair connected to sense amplifier 109.

Defective address detecting circuit 101 includes capacitors C1, C2 and C3, a sense amplifier 121, a N channel MOS transistor (hereinafter referred to as NMOS transistor) Qx1, and an P channel MOS transistor (hereinafter referred to as PMOS transistor) Qx6. Sense amplifier 121 includes PMOS transistors Qx2 and Qx3, and NMOS transistors Qx4 and Qx5.

Memory cell 111 includes a capacitor Cs and an NMOS transistor Qs.

In defective address detecting circuit 101, a floating electrode CPC1 of capacitor C1 is connected to a floating electrode CPC2 of capacitor C2. A fixed electrode SNC2 of capacitor C2 is connected to a sense node Nsn of sense amplifier 121. One electrode of capacitor C3 is connected to a sense node Ng of sense amplifier 121, and another electrode thereof is connected to (½) Vcc potential generating circuit 107. PMOS transistor Qx6 has its gate electrode connected to sense node Ng, and its drain electrode connected to a drain electrode of NMOS transistor Qx1. NMOS transistor Qx1 has its gate electrode receiving 1 bit $A_x$ of an external address, and its source electrode grounded.

2 (n+1) PMOS transistors Qx6 in 2 (n+1) defective address detecting circuits 101 have their source electrodes connected in common at node Nd1.

In sense amplifier 121, PMOS transistors Qx2 and Qx3 have their source electrodes connected to a power supply potential input node Nd2. PMOS transistor Qx2 has its drain electrode connected to a drain electrode of NMOS transistor Qx4. PMOS transistor Qx2 and NMOS transistor Qx4 have their gate electrodes connected to sense node Ng, and PMOS transistor Qx3 and NMOS transistor Qx5 have their drain electrodes connected to sense node Ng. PMOS transistor Qx3 and NMOS transistor Qx5 have their gate electrodes connected to sense node Nsn, and PMOS transistor Qx2 and NMOS transistor Qx4 have their drain electrodes connected to sense node Nsn. NMOS transistors Qx4 and Qx5 have their source electrodes grounded.

Power supply (Vcc) terminal 103 is connected to a fixed electrode SNC1 of capacitor C1 and power supply potential input node Nd2 of sense amplifier 121 in defective address detecting circuit 101.

In memory cell 111, a storage node electrode SNCs of capacitor Cs is connected to a source/drain electrode of NMOS transistor Qs. NMOS transistor Qs has its gate electrode connected to word line WL, and another source/drain electrode connected to bit line/BL.

(½) Vcc potential generating circuit 107 is connected to another terminal of capacitor C3 in defective address detecting circuit 101, a cell plate electrode CPCs of capacitor Cs in memory cell 111, (½) Vcc terminal 105, and another circuit 115 in the DRAM. Driving nodes Nd3 and Nd4 of sense amplifier 109 are connected to sense amplifier driving circuit 113, a sense node Nd5 is connected to bit line BL, and a sense node Nd6 is connected to bit line /BL.

Power supply (Vcc) terminal 103 is provided for a general DRAM, and externally supplies the power supply potential (Vcc) to defective address detecting circuit 101, (½) Vcc potential generating circuit 107, and circuit 115 in the DRAM.

(½) Vcc potential generating circuit 107, which is a circuit for generating a potential half the power supply potential (Vcc), is connected to circuit 115 in the DRAM, is mainly used to supply the (½) Vcc potential and to make cell plate electrode CPCs of capacitor Cs constituting memory cell 111 have the (½) Vcc potential, and is provided for a general DRAM.

Figure 3:
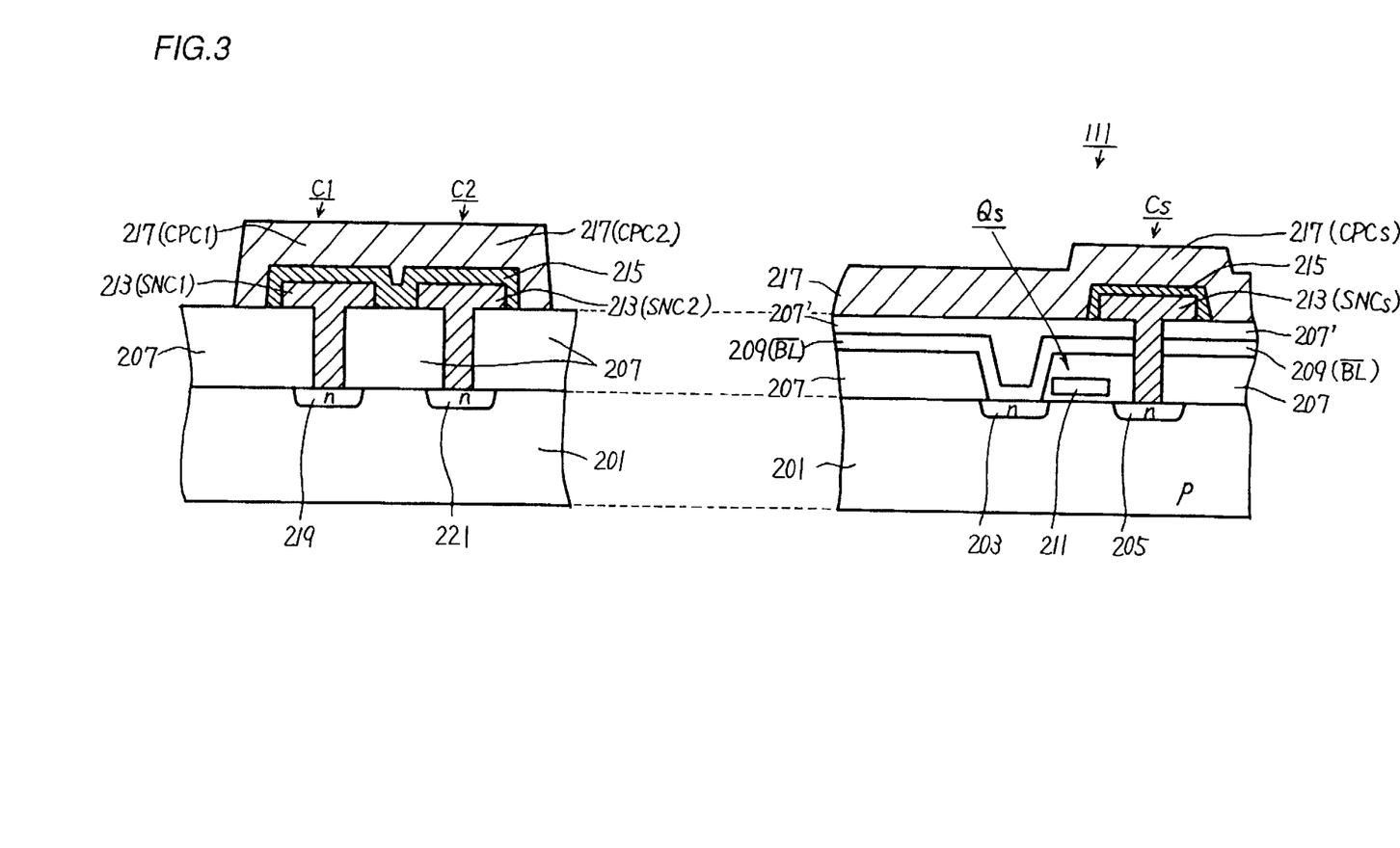
FIG. 3 is a cross sectional view showing a structure of capacitors in a defective address detecting circuit in FIG. 2 and of a capacitor in a memory cell in FIG. 2.

Referring to FIG. 3, in memory cell 111, n diffusion regions 203 and 205 which are source/drain electrodes of NMOS transistor Qs, respectively, are formed at a semiconductor substrate 201. An insulating layer 207 is formed on semiconductor substrate 201 and n diffusion regions 203 and 205. A conductive layer 209 is formed on insulating layer 207, and this will serve as bit line /BL. In addition, a gate electrode 211 (constituting word line WL) of NMOS transistor Qs is formed over the region between n diffusion regions 203 and 205 in insulating layer 207. An insulating layer 207' made of the same insulating material as insulating layer 207 is formed on conductive layer 209. At this time, a contact hole extending to n diffusion region 205 is formed in insulating layers 207' and 207 by etching, and a conductive layer 213 is formed on the contact hole. Conductive layer 213 is etched away except for the portion located in the contact hole and in the vicinity thereof, and the resultant conductive layer serves as storage node electrode SNCs of capacitor Cs. A dielectric layer 215 having a thickness of about 100 Å is formed on conductive layer 213 (storage node electrode SNCs), and is etched away except for the portion which covers storage node electrode SNCs. A conductive layer 217 is formed on insulating layer 207' and dielectric layer 215, and serves as cell plate electrode CPCs of capacitor Cs.

On the other hand, n diffusion regions 219 and 221 are formed at semiconductor substrate 201. An insulating layer 207 is formed on semiconductor substrate 201 and n diffusion regions 219 and 221 in the same step as that of memory cell 111. Contact holes extending to n diffusion regions 219 and 221, respectively, are formed in insulating layer 207 by etching, and a conductive layer 213 is formed on the contact holes in the same step as that of storage node electrode SNCs of memory cell 111. Conductive layer 213 is etched away except for the portion located in the respective contact holes formed on n diffusion regions 219 and 221 and in the vicinities thereof, and the resultant conductive layers serve as fixed electrode SNC1 of capacitor C1 and fixed electrode SNC2 of capacitor C2, respectively. A dielectric layer 215 is formed on conductive layer 213 (fixed electrodes SNC1 and SNC2) in the same step as that of conductive layer 215 of capacitor Cs in memory cell 111, taking advantage of the fact that the dielectric layer 215 has the same thickness as that of the dielectric layer 215 of capacitor Cs in memory cell 111, and the dielectric layer formed is etched away except for the portion which covers fixed electrodes SNC1 and SNC2. Then, a conductive layer 217 is formed on insulating layer 207 and dielectric layer 215 in the same step as that of cell plate electrode CPCs of memory cell 111, and is etched away except for the portion which covers the electrode layer 215. The resultant conductive layer 217 serves as respective floating electrodes CPC1 and CPC2 of capacitors C1 and C2.

As described above, storage node electrode SNCs of capacitor Cs in memory cell 111 and respective fixed electrodes SNC1 and SNC2 of capacitors C1 and C2 in defective address detecting circuit 101 are formed in the same step, cell plate electrode CPCs of capacitor Cs in memory cell 111 and respective floating electrodes CPC1 and CPC2 of capacitors C1 and C2 in defective address detecting circuit 101 are formed in the same step, and the dielectric layer between storage node electrode SNCs and cell plate electrode CPCs of capacitor Cs and the dielectric layer between the electrodes of capacitors C1 and C2 are formed in the same step, and therefore, capacitors C1 and C2 can be formed in the step of forming memory cell 111, so that no additional manufacturing step is necessary.

A step carried out in defective address detecting circuit 101 which corresponds to the conventional step of blowing fuses and a normal operation of the device will now be described.

(i) The step corresponding to the conventional step of blowing fuses

If defective address detecting circuit 101 is to be rendered in the same state as that in which fuses have been blown in the conventional defective address detecting circuit, the following steps are performed.

Step 1: Ultraviolet rays are directed to a device (DRAM) with no power supply potential Vcc supplied from power supply (Vcc) terminal 103. Thus, electrons which have been charged in floating electrode CPC1 of capacitor C1 and floating electrode CPC2 of capacitor C2 are discharged in the manufacturing step of the device (initialization).

Step 2: A potential applied from power supply (Vcc) terminal 103 is pulled up to Vcc×2.

Step 3: A potential Vcc×2+δ slightly higher than the potential on power supply (Vcc) terminal 103 is applied from (½) Vcc terminal 105.

Thus, PMOS transistor Qx3 and NMOS transistor Qx4 are turned on, while PMOS transistor Qx2 and NMOS transistor Qx5 are turned off. In addition, charges+Q are charged in each of fixed electrode SNC1 of capacitor C1 and floating electrode CPC2 of capacitor C2, while charges-Q are charged in each of floating electrode CPC1 of capacitor C1 and fixed electrode SNC2 of capacitor C2, where Q=Vcc×(capacitance of capacitor C1).

Step 4: Ultraviolet rays are directed only to capacitor C2 with NMOS transistor Qx4 being on. Charges+Q in floating electrode CPC2 of capacitor C2 and charges-Q in fixed electrode SNC2 thereof are then discharged. If ultraviolet rays are stopped from being directed thereto, charges-Q are left in floating electrode CPC1 of capacitor C1 and floating electrode CPC2 of capacitor C2.

If defective address detecting circuit 101 is to be rendered in the same state as that in which fuses are not blown, only the above mentioned steps 1 to 3 are performed and the step 4 will not be carried out.

If a defective address $A_0, A_1, \ldots, A_X, \ldots, A_n$ is to be registered in defective address registering circuit 100 of FIG. 1, for example, ultraviolet rays are selectively directed only to capacitor C2 of defective address detecting circuit 101 which receives $\overline{A_0}, \overline{A_1}, \ldots, \overline{A_X}, \ldots, \overline{A_n}$.

(ii) Normal operation of the device

When the device operates normally, the power supply potential Vcc is applied from power supply (Vcc) terminal 103. Furthermore, (½) Vcc terminal 105 is opened.

When no charge is charged in floating electrode CPC1 of capacitor C1 and floating electrode CPC2 of capacitor C2 (corresponding to the case where fuses are not blown), a potential on sense node Ng connected through capacitor C3 to (½) Vcc potential generating circuit 107 reaches to (½) Vcc by coupling while the power supply of (½) Vcc potential generating circuit 107 is being activated. In addition, a potential on sense node Nsn connected through series-connected capacitors C1 and C2 to power supply (Vcc) terminal 103 attains Vcc by coupling while the power supply of power supply (Vcc) terminal 103 is being activated.

Thus, PMOS transistor Qx2 and NMOS transistor Qx5 are turned on, while PMOS transistor Qx3 and NMOS transistor Qx4 are turned off. Therefore, when a potential on power supply (Vcc) terminal 103 is completely pulled up to Vcc, the potential on sense node Ng is pulled down to the ground potential, and PMOS transistor Qx6 is turned on, achieving the state corresponding that in which fuses are not blown in the conventional example.

On the other hand, when charges-Q have been charged in floating electrode CPC1 of capacitor C1 and floating electrode CPC2 of capacitor C2 (corresponding to the case where fuses have been blown in the conventional defective address detecting circuit), sense node Nsn is retained at a potential lower than the power supply potential applied from power supply (Vcc) terminal 103 by Vcc. Therefore, PMOS transistors Qx3 and NMOS transistor Qx4 are turned on and PMOS transistor Qx2 and NMOS transistor Qx5 are turned off while the power supply of power supply (Vcc) terminal 103 is being activated. Thus, a potential on sense node Ng attains Vcc and PMOS transistor Qx6 is turned off, achieving the step corresponding to that in which fuses have been blown in the conventional example.

As has been described above, in accordance with the defective address detecting circuit in the semiconductor memory device of the first embodiment, a defective address is registered by directing ultraviolet rays without blowing fuses, interconnection wires, circuit elements or the like will not be damaged by blowing of the fuses, eliminating the need for larger layout area for the fuse portions.

Furthermore, since the capacitors in the defective address detecting circuit are formed of the same layer as the capacitor in the DRAM memory cell, a non-volatile address memory having a floating node can be formed without increase in the number of manufacturing steps.

Accordingly, a semiconductor memory device having reduced layout area, requiring no addition manufacturing steps, and capable of registering a defective address and of replacing a defective memory cell with a spare memory cell in a non-volatile memory such as DRAM, and a defective address registering method thereof can be provided.

(2) Second Embodiment

Figure 4:
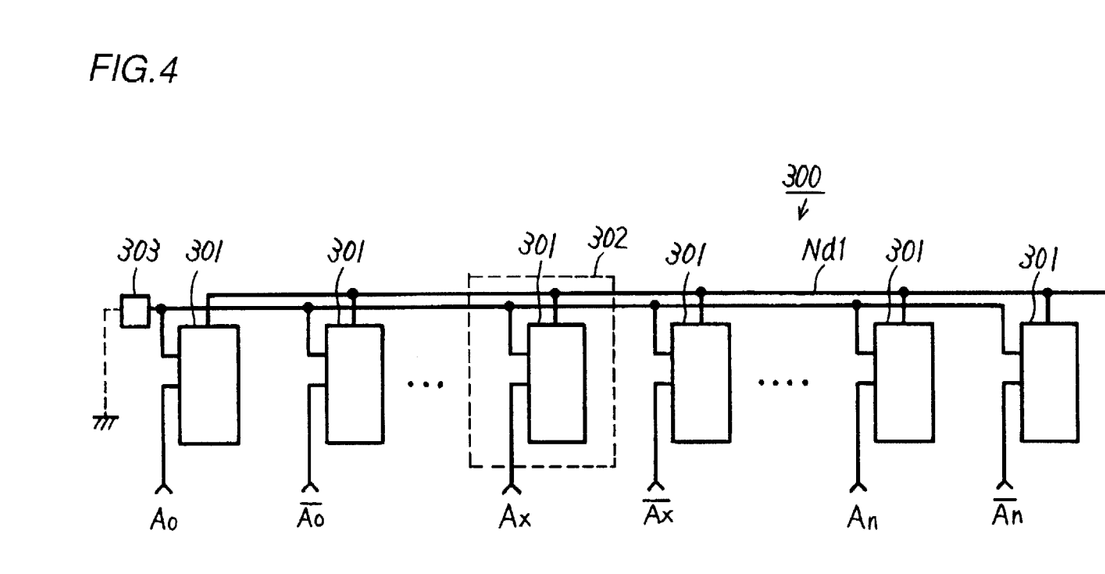
FIG. 4 is a block diagram showing a structure of a defective address registering circuit in a semiconductor memory device in accordance with another embodiment of the present invention.

Referring to FIG. 4, a defective address registering circuit 300 in a DRAM of a second embodiment of the present invention includes 2 (n+1) defective address detecting circuits 301 each provided corresponding to 1 bit $A_X$ (where X=0, 1, ..., n) of an external address or 1 bit $A_X$ (where X=0, 1, ..., n) of a complementary address thereof, and a registering terminal 303.

Registering terminal 303 is connected in common to 2 (n+1) defective address detecting circuits 301. Furthermore, 2 (n+1) defective address detecting circuits 301 are connected in common at a node Nd1.

Defective address registering circuit 300 of FIG. 4 corresponds to conventional defective address registering circuit 500 of FIG. 7, and defective address detecting circuit 301 of FIG. 4 corresponds to conventional defective address detecting circuit 501 of FIG. 7.

Figure 5:
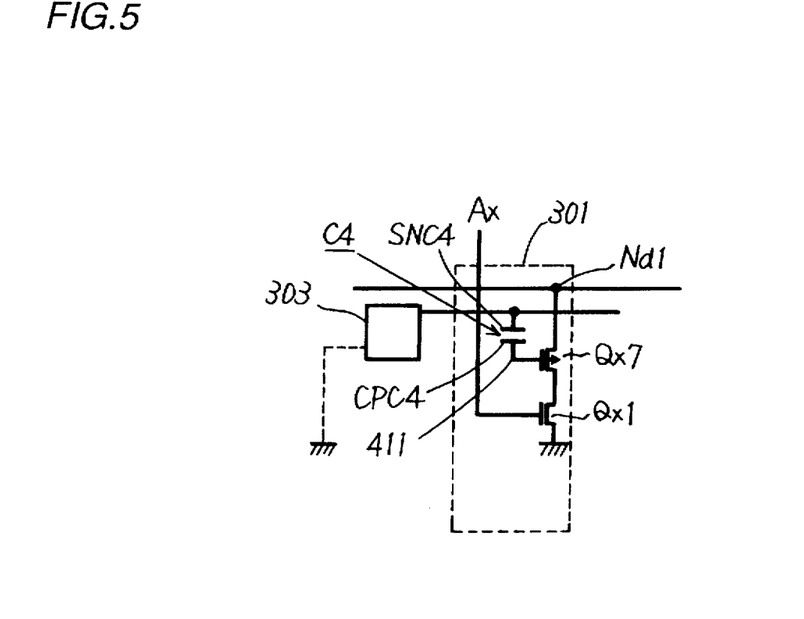
FIG. 5 is a circuit diagram showing a defective address detecting circuit in FIG. 4.

In FIG. 5, one of 2 (n+1) defective address detecting circuits 301 is shown representatively. Referring to FIG. 5, defective address detecting circuit 301 includes a capacitor C4, a PMOS transistor Qx7, and an NMOS transistor Qx1.

In defective address detecting circuit 301, a floating electrode of capacitor C4 is connected to a gate electrode CPC4 of PMOS transistor Qx7. PMOS transistor Qx7 has its drain electrode connected to a drain electrode of NMOS transistor Qx1. NMOS transistor Qx1 has its source electrode grounded, and its gate electrode receiving corresponding 1 bit $A_x$ of an external address.

Registering terminal 303 is connected to a fixed electrode SNC4 of capacitor C4 in defective address detecting circuit 301.

Respective PMOS transistors Qx7 in 2 (n+1) defective address detecting circuits 301 have their source electrodes connected in common at node Nd1.

A ground potential is applied to registering terminal 303 during normal operation, and a high potential is applied thereto during registration of an address.

Since a memory cell included in the DRAM together with defective address detecting circuit 301 is similar to memory cell 111 shown in FIGS. 2 and 3, description thereof will be given using FIGS. 2 and 3.

Figure 6:
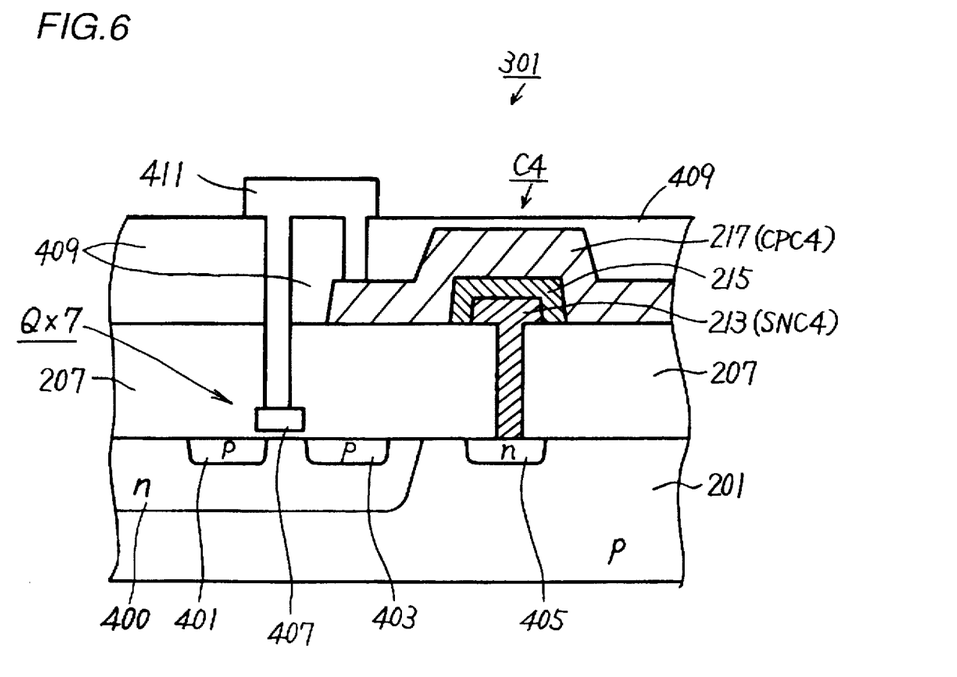
FIG. 6 is a cross sectional view showing a structure of a capacitor and of a PMOS transistor in a defective address detecting circuit in FIG. 5.

Referring to FIGS. 2, 3 and 6, an n well 400 and an n diffusion region 405 are formed at a semiconductor substrate 201, and p diffusion regions 401 and 403 are formed at n well 400. An insulating layer 207 is formed thereon in the same step as of memory cell 111. A contact hole extending to n diffusion region 405 is formed in insulating layer 207 by etching, and a gate electrode 407 of PMOS transistor Qx7 is formed over the region between p diffusion regions 401 and 403 in insulating layer 207. A conductive layer 213 is formed on insulating layer 207 in the same step as that of memory cell 111, and is etched away except for the portion located in the contact hole and in the vicinity thereof. The resultant conductive layer 213 serves as fixed electrode SNC4 of capacitor C4. A dielectric layer 215 is formed on insulating layer 207 and fixed electrode SNC4 in the same step as that of memory cell 111, and is etched away except for the portion which covers fixed electrode SNC4. The resulting dielectric layer 215 serves as a dielectric between the electrodes of capacitor C4. A conductive layer 217 is formed on insulating layer 207 and dielectric layer 215 in the same step as that of memory cell 111, and etched away except for the portion which covers dielectric layer 215 and for the vicinity thereof. The resultant conductive layer 217 serves as floating electrode CPC4 of capacitor C4. An insulating layer 409 is formed on insulating layer 207 and floating electrode CPC4, contact holes respectively extending to gate electrode 407 and floating electrode CPC4 are formed by etching, and gate electrode 407 and floating electrode CPC4 are connected to each other through an aluminum interconnection 411 of a first layer.

PMOS transistor Qx7 in defective address detecting circuit 301 uses p diffusion regions 401 and 403 as its source/drain electrodes, and is constituted by these p diffusion regions 401 and 403 and gate electrode 407.

As described above, storage node electrode SNCs of capacitor Cs in memory cell 111 and fixed electrode SNC4 of capacitor C4 in defective address detecting circuit 301 are formed in the same step, cell plate electrode CPCs of capacitor Cs in memory cell 111 and floating electrode CPC4 of capacitor C4 in defective address detecting circuit 301 are formed in the same step, and dielectric 215 between the electrodes of capacitor Cs in memory cell 111 and dielectric 215 between the electrodes of capacitor C4 in defective address detecting circuit 301 are formed in the same step, and therefore, capacitor C4 can be formed in the step of forming memory cell 111, eliminating the need for an additional manufacturing step.

The step in defective address detecting circuit 301 corresponding to the conventional step of blowing fuses and the normal operation of the device will now be described.

(i) The step corresponding to the conventional step of blowing fuses

First, capacitor C4 is initialized. More specifically, ultraviolet rays are directed to the device (DRAM) with no power supply potential Vcc being supplied. Thus, electrons which have been charged in floating electrode CPC4 of capacitor C4 are discharged in the manufacturing step of the device.

If defective address detecting circuit 301 is to be rendered in the same state as that in which fuses have been blown, an "H" level is applied as corresponding 1 bit $A_x$ of an external address. Then, NMOS transistor Qx1 is turned on.

If defective address detecting circuit 301 is to be rendered in the same state as that in which fuses are not blown, an "L" level is applied as corresponding 1 bit $A_x$ of an external address. Then, NMOS transistor Qx1 is turned off.

Accordingly, when an address of a defective memory cell is to be registered in defective address registering circuit 300, the address is applied to an input pin of a normal external address.

In this condition, a high potential in the range from about 15 V to about 20 V is applied to registering terminal 303.

In the defective address detecting circuit with NMOS transistor Qx1 being on, the drain electrode of PMOS transistor Qx7 has a ground potential, and a high voltage is applied between the electrodes of capacitor C4. Therefore, tunnel current flows between the electrodes of capacitor C4, and positive charges are charged in the gate electrode of PMOS transistor Qx7.

On the other hand, in the defective address detecting circuit with NMOS transistor Qx1 being off, the drain electrode of PMOS transistor Qx7 is in a floating state, and only a low voltage is applied between the electrodes of capacitor C4. Therefore, tunnel current will not flow between the electrodes of capacitor C4, and no charge is charged in the gate electrode of PMOS transistor Qx7.

(ii) Normal operation of the device

When the device operates normally, registering terminal 303 is grounded.

If positive charges have been charged in the gate electrode of PMOS transistor Qx7, the gate electrode of PMOS transistor Qx7 has a potential higher than the ground potential, and therefore, PMOS transistor Qx7 is turned on, whereby defective address detecting circuit 303 is rendered in the state corresponding to that in which fuses have been blown in the conventional example.

If no charge is charged in the gate electrode of PMOS transistor Px7, the gate electrode of PMOS transistor Qx7 has a potential higher than the ground potential, and therefore, PMOS transistor Qx7 is turned on, whereby defective address detecting circuit 303 is rendered in the state corresponding to that in which fuses are not blown in the conventional example.

As has been described above, in accordance with the defective address detecting circuit in the semiconductor memory device of the second embodiment, the capacitor in the defective address detecting circuit is formed of the same layer as the capacitor in the memory cell, whereby a non-volatile address memory having a floating node can be formed without an additional manufacturing step. In addition, since fuses are not used, the need for larger layout area for the fuse portions is eliminated as compared to the case of the conventional method of registering a defective address by blowing fuses. Furthermore, electric registration of a defective address can be easily carried out only by input of an external address.

Accordingly, a semiconductor memory device having reduced layout area, requiring no additional manufacturing step, and capable of registering a defective address and replacing a defective memory cell with a spare memory cell in a non-volatile memory such as DRAM, and a defective address registering method thereof can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of memory cells each including a first capacitor having a cell plate electrode, a storage node electrode, and a first dielectric layer formed between said cell plate electrode and said storage node electrode; and
   a plurality of address detecting means capable of registering a defective address indicating a defective memory cell out of said plurality of memory cells for detecting whether an external address matches said defective address or not, and each corresponding to 1 bit of said external address or complementary 1 bit thereof, wherein
   each of said plurality of address detecting means includes a second capacitor having a floating electrode formed in a same layer as said cell plate electrode, a fixed electrode formed in a same layer as said storage node electrode, and a second dielectric layer formed in a same layer as said first dielectric layer and formed between said floating electrode and said fixed electrode.

2. A semiconductor memory device, comprising:
   a plurality of memory cells;
   a plurality of address detecting means capable of registering a defective address indicating a defective memory cell out of said plurality of memory cells for detecting whether an external address matches said defective address or not, and each corresponding to 1 bit of said external address or complementary 1 bit thereof;
   a first terminal; and
   a second terminal, wherein
   each of said plurality of address detecting means includes
   a first capacitor having one electrode connected to said first terminal,
   a second capacitor having one electrode connected to another electrode of said first capacitor,
   a sense amplifier having a first sense node connected to another electrode of said second capacitor and a second sense node,
   a third capacitor having one electrode connected to said second sense node of said sense amplifier and another electrode connected to said second terminal,
   a first MOS transistor having a source/drain electrode grounded and a gate electrode receiving corresponding 1 bit of said address, and
   a second MOS transistor having a source/drain electrode connected to another source/drain electrode of said first MOS transistor and a gate electrode connected to said second sense node of said sense amplifier, wherein said second MOS transistor in one of said plurality of address detecting means has another source/drain electrode connected to another source/drain electrode of said second MOS transistor in another address detecting means.

3. The semiconductor memory device in accordance with claim 2, wherein
   each of said memory cells includes a fourth capacitor having a cell plate electrode formed in a same layer as said another electrode of said first capacitor and said one electrode of said second capacitor, a storage node electrode formed in a same layer as said one electrode of said first capacitor and said another electrode of said second capacitor, and a first dielectric layer formed between said cell plate electrode and said storage node electrode, and
   each of said first and said second capacitors has a second dielectric layer formed in a same layer as said first dielectric layer and formed between said one electrode and said another electrode thereof.

4. A semiconductor memory device, comprising:
   a plurality of memory cells;
   a plurality of address detecting means capable of registering a defective address indicating a defective memory cell out of said plurality of memory cells for detecting whether an external address matches said defective address or not, and each corresponding to 1 bit of said external address or complementary 1 bit thereof; and
   a registering terminal, wherein
   each of said plurality of address detecting means includes
   a first capacitor having one electrode connected to said registering terminal,
   a first MOS transistor having a gate electrode connected to another electrode of said first capacitor, and
   a second MOS transistor having a source/drain electrode grounded, another source/drain electrode connected to a source/drain electrode of said first MOS transistor, and a gate electrode receiving corresponding 1 bit of said external address, wherein
   said first MOS transistor in one of said plurality of address detecting means has another source/drain electrode connected to another source/drain electrode of said first MOS transistor in another address detecting means.

5. The semiconductor memory device in accordance with claim 4, wherein
   each of said memory cells includes a second capacitor having a cell plate electrode formed in a same layer as said another electrode of said first capacitor, a storage node electrode formed in a same layer as said one electrode of said first capacitor, and a first dielectric layer formed between said cell plate electrode and said storage node electrode, and
   said first capacitor has a second dielectric layer formed in a same layer as said first dielectric layer and formed between said one electrode and said another electrode.

6. A method of registering an address of a semiconductor memory device including
   a plurality of memory cells,
   a plurality of address detecting means capable of registering a defective address indicating a defective memory cell out of said plurality of memory cells for detecting whether an external address matches said defective address or not, and each corresponding to 1 bit of said external address or complementary 1 bit thereof, a first terminal, and a second terminal, wherein each of said plurality of address detecting means includes a first capacitor having one electrode connected to said first terminal, a second capacitor having one electrode connected to another electrode of said first capacitor, a sense amplifier having a first sense node connected to another electrode of said second capacitor and a second sense node, a third capacitor having one electrode connected to said second sense node of said sense amplifier and another electrode connected to said second terminal, a first MOS transistor having a source/drain electrode grounded and a gate electrode receiving corresponding 1 bit of said address, and a second MOS transistor having a source/drain electrode connected to another source/drain electrode of said first MOS transistor and a gate electrode connected to said second sense node of said sense amplifier, wherein said second MOS transistor in one of said plurality of address detecting means has another source/drain electrode connected to another source/drain electrode of said second MOS transistor in another address detecting means, said method comprising the steps of:

applying a prescribed voltage to said first terminal;

applying a voltage higher than said prescribed voltage to said second terminal; and selectively directing ultraviolet rays to respective said second capacitors of said plurality of address detecting means.

* * * * *